United States Patent [19]

Akiguchi et al.

[11] Patent Number: 5,137,936
[45] Date of Patent: Aug. 11, 1992

[54] METHOD FOR PACKAGING ELECTRONIC PARTS AND ADHESIVE FOR USE IN SAID METHOD

[75] Inventors: Takashi Akiguchi, Osaka; Yukio Maeda, Hirakata; Daisuke Irii, Hiratsuka, all of Japan

[73] Assignee: Matsushita Electric Industrial Co., Ltd., Osaka, Japan

[21] Appl. No.: 558,236

[22] Filed: Jul. 26, 1990

[30] Foreign Application Priority Data

Jul. 26, 1989 [JP] Japan .................................. 1-194643

[51] Int. Cl.$^5$ ............................................. C08F 2/46
[52] U.S. Cl. ..................... 522/170; 522/103; 522/40
[58] Field of Search ............... 522/170, 103, 40

[56] References Cited

U.S. PATENT DOCUMENTS 4,425,209 1/1984 Saeki et al. ........................ 522/103
4,880,486 11/1989 Maeda ............................. 156/273.5

FOREIGN PATENT DOCUMENTS 285967 12/1987 Japan .

*Primary Examiner*—Marion E. McCamish
*Assistant Examiner*—Mark A. Chapman
*Attorney, Agent, or Firm*—Wenderoth, Lind & Ponack

[57] ABSTRACT

An adhesive composition comprising 10 to 60 parts by weight per 100 parts of the total weight of components (1) to (4) of a monofunctional (meth)acrylic monomer, 0.01 to 10 parts by weight per 100 parts of the total weight of components (1) to (4) of a compound having at least two (meth)acryloyl groups in a molecule, 30 to 80 parts by weight per 100 parts by weight of the total weight of components (1) to (4) of a heat resistant epoxy resin, 0.1 to 20 parts by weight per 100 parts by weight of the total weight of components (1) to (4) of an imidazole compound, 0.001 to 10 parts by weight per 100 parts by weight of the total weight of components (1) to (4) of a photopolymerization initiator, and 0.01 to 20 parts by weight per 100 parts by weight of the total weight of components (1) to (4) of a thixotropic agent, with which an electronic part can be effectively packaged to a printed board.

8 Claims, 2 Drawing Sheets

METHOD FOR PACKAGING ELECTRONIC PARTS AND ADHESIVE FOR USE IN SAID METHOD

BACKGROUND OF THE INVENTION

1. Field of the Invention

The present invention relates to a method for packaging electronic parts and an adhesive for use in said method.

2. Description of the Related Art

When an electronic part such as a chip resistor or a chip capacitor is soldered on a printed board, it is temporarily mounted on the printed board with a photopolymerizable and thermopolymerizable adhesive comprising a polymerizable compound having different photopolymerizable functional group and thermopolymerizable functional group (cf. Japanese Patent Kokai Publication No. 63-72195). In such method, the adhesive is applied on a part of a board surface at which the electronic part is mounted and gelled through irradiation of light, whereby its viscosity is increased. Thereafter, the electronic part is pressed against the viscous adhesive to temporarily mount the part to the printed board and then soldered to the printed board. During soldering, the adhesive is thermally cured.

In the above packaging method, when the adhesive is applied to the printed board, its viscosity is kept low so that the adhesive can be easily applied with suitable means such as a dispenser, and when the electronic part is mounted, the viscosity of the adhesive is increased to decrease flowability of the adhesive and to impart pressure sensitive adhesion so as to prevent dislocation of the electronic part. Further, while soldering the electronic part to the printed board, the adhesive is thermally cured to impart heat resistance to the adhesive and to prevent dislocation of the electronic part. The adhesives to be used in the above packaging method are disclosed in Japanese Patent Kokai Publication No. 63-15948.

Although the above packaging method may achieve the intended effects to make mounting of electronic parts easy, it is still desired to improve the packaging method so as to further decrease packaging defects of the electronic parts. That is, improvement of flowability of an adhesive is still desired.

SUMMARY OF THE INVENTION

An object of the present invention is to provide an adhesive composition which is used in packging an electronic part to a printed board for temporarily mounting the electronic part to the printed board.

Another object of the present invention is to provide a method for packaging an electronic part to a printed board with using a new type of adhesive composition.

According to one aspect of the present invention, there is provided an adhesive composition which comprises (1) 10 to 60 parts by weight per 100 parts of the total weight of components (1) to (4) of a monofunctional (meth)acrylic monomer of the formula (I):

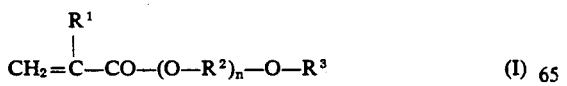
(I)

wherein $R^1$ is a hydrogen atom or a methyl group; $R^2$ is a methylene group ($-CH_2-$), and ethylene group ($-C_2H_4-$) or a propylene group ($-C_3H_6-$); $R^3$ is an alkyl group, a phenyl group which may be substituted with not more than two alkyl groups or a group of the formula:

$$-CO-HN-R^4$$

in which $R^4$ is an alkyl group; and n is 1, 2 or 3, (2) 0.01 to 10 parts by weight per 100 parts of the total weight of components (1) to (4) of a compound having at least two (meth)acryloyl groups in a molecule, (3) 30 to 80 parts by weight per 100 parts by weight of the total weight of components (1) to (4) of a heat resistant epoxy resin, (4) 0.1 to 20 parts by weight per 100 parts by weight of the total weight of components (1) to (4) of an imidazole compound, (5) 0.001 to 10 parts by weight per 100 parts by weight of the total weight of components (1) to (4) of a photopolymerization initiator, and (6) 0.01 to 20 parts by weight per 100 parts by weight of the total of components (1) to (4) of a thixotropic agent.

According to the second aspect of the present invention, there is provided a method for packaging an electronic part to a printed board, which comprises steps of applying a mass of the adhesive composition of the present invention to a part of a printed board where an electronic part is mounted, gellating the applied adhesive composition to impart pressure sensitive adhesion to the composition, mounting an electronic part on the adhesive composition and soldering the electronic part to the printed board.

DETAILED DESCRIPTION OF THE DRAWINGS

Figure 1:
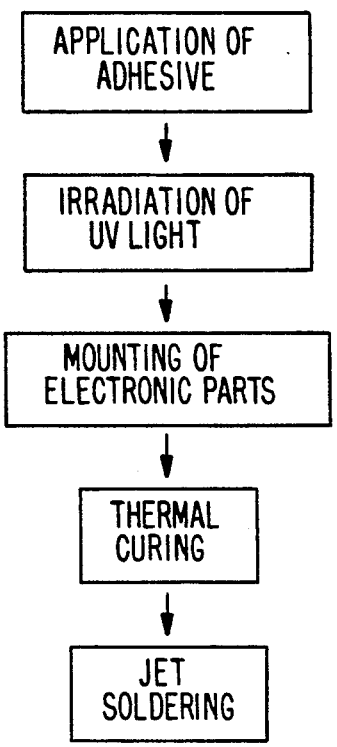
FIGS. 1 and 3 are flow charts of the methods employed in Examples 1 and 2, respectively.

Now, each component of the adhesive composition of the present invention is explained in detail.

The monofunctional (meth)acrylate monomer (1) of the formula (I) is polymerized through irradiation of UV light whereby the adhesive composition is gelled and a viscosity of the composition is increased to impart the pressure sensitive adhesion to the composition.

Specific examples of the monofunctional (meth)acrylate (1) are methoxyethyl (meth)acrylate, methoxypropyl (meth)acrylate, ethoxyethyl (meth)acrylate, ethoxypropyl (meth)acrylate, butoxyethyl (meth)acrylate, butoxypropyl (meth)acrylate, phenoxyethyl (meth)acrylate, phenoxypropyl (meth)acrylate, nonylphenoxyethyl (meth)acrylate, nonylphenoxypropyl (meth)acrylate, ethyl (meth)acrylate butylcarbamate, ethyl (meth)acrylate propylcarbamate, propyl (meth)acrylate butylcarbamate, propyl (meth)acrylate propylcarbamate and the like.

The compound having at least two (meth)acryloyl groups in a molecule is polymerized through irradiation of UV light whereby the adhesive composition is gelled and the pressure sensitive adhesion of the composition is adjusted. A structure of such compound is not critical. For example, polyol poly(meth)acrylate, modified polyol poly(meth)acrylate, polyester (meth)acryloyl epoxy (meth)acrylate and urethane (meth)acrylate can be advantageously used.

Specific examples of the polyol poly(meth)acrylate are polyethylene glycol di(meth)acrylate, polypropylene glycol di(meth)acrylate, neopentyl glycol di(meth)acrylate, 1,6-hexanediol di(meth)acrylate, trimethylolpropane tri(meth)acrylate, pentaerythritol tri(meth)acrylate, dipentaerythritol hexa(meth)acrylate and the like.

The heat resistant epoxy resin (3) is cured by heating and prevents dislocation of the electronic part. It should be compatible with the monofunctional (meth)acrylic monomer (1) and should not interfere with curing of the acrylic compound (2). In addition, the epoxy resin (3) should be heat resistant to increase heat resistant of the cured material of the adhesive composition of the present invention. Preferred examples of the heat resistant epoxy resin are (a) triphenylmethanetriglycidylether

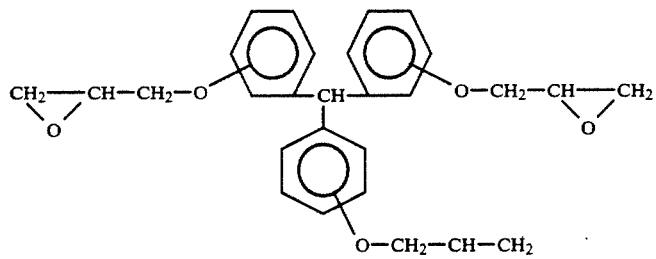

(b) resorcinoldiglycidylether

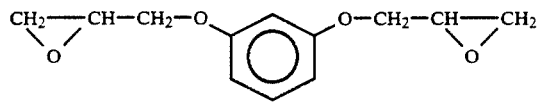

(c) phenol-novolac type epoxy resin

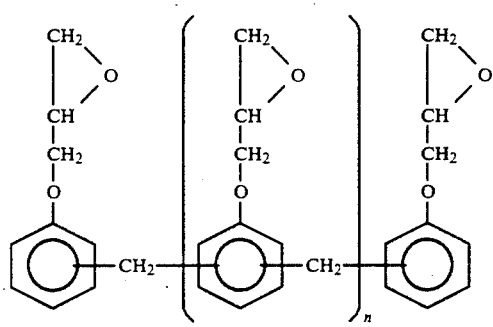

(d) hydroxyethylisocyanuratetriglycidylether

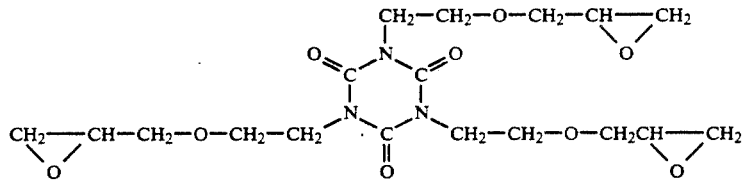

(e) EHPE-3150 (trade name, Daicel Chemical)

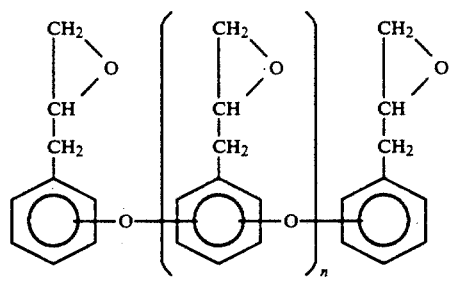

Specific examples of the modified polyol poly(meth)acrylate are tri(meth)acrylate of an adduct of trimethylolpropane with propylene oxide, di(meth)acrylate of an adduct of bisphenol-A with ethylene oxide and the like.

A curing agent for the above epoxy resin should cure the composition in a short time and have good storage stability. According to the present invention, as the curing agent for the epoxy resin, the imidazole compound (4) is used. Kinds of the imidazole compound (4)

are not critical. Commercially available imidazole compounds include Curesol 2MZ-AZIME and Curesol 2P4MHZ (both manufactured by Shikoku Fine Chemicals).

To photopolymerize the acrylic compound (2), the photopolymerization initiator (5) is used. its kind is not critical, and the cleavage type or hydrogen-drawing type the photopolymerization initiator is preferably used. Examples of the cleavage type photopolymerization initiator are benzoinethylether, diethoxyacetophenone, benzildimethyl-ketal, 2-hydroxy-2-methylpropiophenone and 1-hydroxycyclohexyl phenyl ketone. Examples of the hydrogen-drawing type photopolymerization initiator are benzil, benzophenone and 2,4-diethylthioxanthone.

When the adhesive composition is applied to the part of the printed board where the electronic part is temporarily mounted, an automatic dispenser is preferably used. The adhesive composition is dispensed and applied on the printed board from a nozzle of the automatic dispenser. To increase application speed of the adhesive composition, the composition should not be cobwebbed. Since the applied adhesive composition flows outwardly from the applied area, problems such as conducting failure occur. Therefore, such flowing should be prevented. That is, the adhesive composition for temporarily mounting the electronic part to the printed board is required to be thixotropic. Then, the adhesive composition of the present invention comprises the thixotropic agent (6). As the thixotropic agent, any of the conventional ones may be used. Among them, saturated aliphatic amides such as amides of capric acid, lauric acid, stearic acid, arachic acid and behenic acid are preferred. The saturated aliphatic amide is preferably swelled with an aliphatic alcohol (e.g. methanol, ethanol, pronanol, etc.), an aromatic solvent (e.g. benzene, toluene, xylene, etc.) or a mixture thereof.

Each component of the adhesive composition of the present invention is contained in the composition in the following amount. Herein, the amount of the component is in terms of part(s) by weight per 100 parts of the total weight of components (1) to (4).

When the monofunctional (meth)acrylic monomer (1) is used in a larger amount, better pressure sensitive adhesion is imparted to the composition after UV light irradiation. However, the (meth)acrylic monomer (1) is used in a too large amount, the thermosetting of the epoxy resin may be prevented. Then, the amounts of the monofunctional (meth)acrylic monomer (1) and the heat resistant epoxy resin (3) are 10 to 60 parts by weight and 30 to 80 parts by weight, respectively, preferably 10 to 50 parts by weight and 50 to 80 parts by weight, respectively.

The amount of the acrylic compound (2) depends on the number of (meth)acryloyl groups and the molecular weight and in the range of 0.01 to 10 parts by weight.

When the amount of the imidazole compound which is a latent curing agent for the epoxy resin is larger, the curing time is shorter but the pot life is shortened. Then, the imidazole compound (2) is used in an amount of 0.1 to 20 parts by weight.

The amount of the photopolymerization initiator (5) is from 0.001 to 10 parts by weight, preferably from 0.01 to 5 parts by weight.

The amount of the thixotropic agent (6) is from 0.01 to 20 parts by weight, preferably from 0.1 to 20 parts by weight.

In addition to the above essential components, the adhesive composition of the present invention may contain conventionally used additives such as a polymerization inhibitor, a filler, a dispersant, a pigment, an anti-aging agent and an organic peroxide in such amount that the desired effects are not deteriorated.

Since the adhesive composition of the present invention contains both the photocurable component and the thermosetting component, before curing, they have such low viscosity that the composition can be applied with the dispenser, and after irradiation of UV light, the photocurable component is at least partly cured while the thermosetting component is not cured. The uncured thermosetting component acts as a plasticizer, and the adhesive composition has viscosity increased to a level at which the electronic part can be temporarily mounted and pressure sensitive adhesion such that the electronic part can be temporarily mounted when the electronic part is pressed onto the adhesive composition.

During the soldering of the electronic part to the printed board, the thermosetting component is cured with heat applied for soldering, whereby the dislocation of the electronic part is effectively prevented.

When the saturated aliphatic acid amide such as stearamide is contained in the adhesive composition, it is dispersed in the adhesive composition in a network form and retards the photocuring of the composition and imparts stable adhesivity to the adhesive composition.

PREFERRED EMBODIMENTS OF THE INVENTION

The present invention will be illustrated by the following Examples.

EXAMPLE 1

Ethylacrylate butylcarbamate of the formula: $CH_2=CH-CO-O-CH_2CH_2-O-CO-NH-C_4H_9$ (NISSOCURE UM-1 manufactured by Shin-Nisso Chemical Industry) (24 g) as a monofunctional acrylic monomer (1) polypropyleneglycol diacrylate having an average molecular weight of about 1000 (1 g) as a compound having at least two acryloyl groups in a molecule (2), triphenylmethanetriglycidylether (TACTIX 742 distributed by Dow Chemical, Japan) (70 g) as a heat resistant epoxy resin (3), Curesol 2MZ-AZINE (manufactured by Shikoku Fine Chemicals) (5 g) as a curing agent (4) for the epoxy resin, 2-hydroxycyclohexylbenzophenone (3 g) as a photopolymerization initiator (4), stearamide swelled with xylene (10 g) as a thixotropic agent and talc (50 g) as a filler were mixed to formulate an adhesive composition.

Figure 2A:
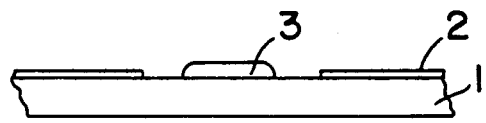
FIGS. 2A-D and 4A-D are partial side views of printed boards in each steps of FIGS. 1 and 3, respectively.

With the prepared adhesive composition, an electronic part was packaged by the steps shown in FIG. 1. That is, as shown in FIG. 2A, with a pressure dispensing type dispenser (not shown), a mass of the adhesive composition 3 was applied on each part of a printed board 1 at which a respective electronic part was mounted. Numeral 2 indicates soldering lands. Thereafter, the adhesive composition was irradiated with UV light from a black light for 10 seconds whereby the adhesive composition was gelled and lost flowability and pressure sensitive adhesion was imparted to the adhesive composition.

The UV light irradiation may be carried out with a chemical lump, a sun lamp or an illumination mercury lamp. Alternatively, the adhesive composition can be irradiated with a lamp having high intensity such as a high pressure mercury lamp or a metal halide lamp in a shorter irradiation time.

Figure 2B:
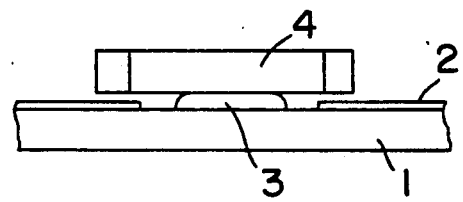

The printed board 1 was set on an apparatus for automatically mounting tip parts, and a tip electronic part 4 was mounted on and pressed against the adhesive composition 3 with a mounting head to temporarily mount the electronic part 4 as shown in FIG. 2B. In this state, the electronic part 4 was not dislocated when the printed board 1 was vibrated or moved at a high speed.

Figure 2C:
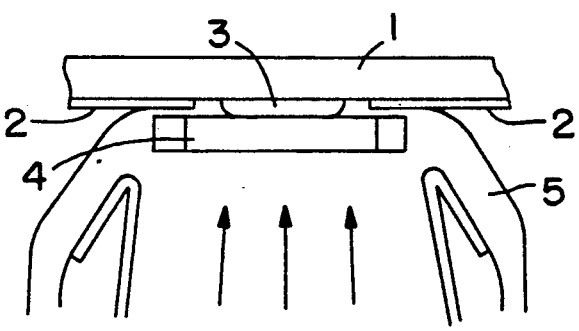
Figure 2D:
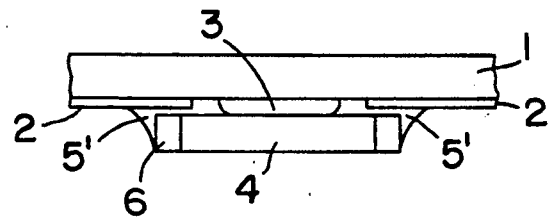

Then, the printed board 1 was heated at 150° C. for 3 minutes to cure the adhesive composition 3, whereby the heat resistance of the adhesive composition was improved and the pressure sensitive adhesion vanished. Thereafter, the printed board 4 was subjected to a jet solder flow 5 with facing the electronic part-mounted side downward as shown in FIG. 2C. Thereby, the soldering lands 2 of the printed board 1 and respective electrodes 6 of the electronic part were soldered with solder masses 5' of as shown in FIG. 2D. Simultaneously, the adhesive composition was thermally cured.

The thermal curing of the adhesive composition may be effected by preheating of the printed board applied with a flux before jet soldering, or a combination of preheating and heating in the soldering step.

EXAMPLE 2

An adhesive composition was formulated in the same manner as in Example 1.

Figure 3:
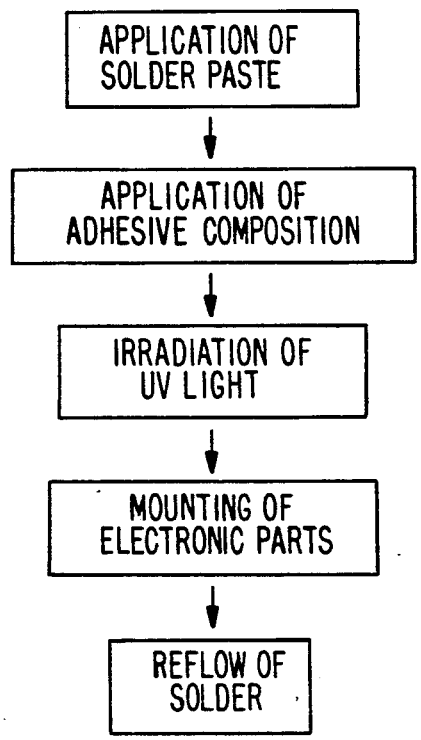

With the formulated adhesive composition, an electronic part was packaged by the steps shown in FIG. 3.

Figure 4A:
Figure 4B:
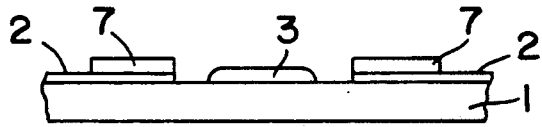

First, a solder paste 7 was coated on soldering lands 2 of the printed board by screen printing as shown FIG. 4A. Then, as shown in FIG. 4B, a mass of the adhesive composition 3 was applied to each part of the printed board 1 at which a respective electronic part was mounted. Thereafter, the adhesive composition was irradiated with UV light from the black light for 10 seconds whereby the adhesive composition was gelled and lost flowability and pressure sensitive adhesion was imparted to the adhesive composition.

In this case, the UV light irradiation may be also carried out with a chemical lump, a sun lamp or an illumination mercury lamp. Alternatively, the adhesive composition can be irradiated with a lamp having high intensity such as a high pressure mercury lamp or a metal halide lamp in a shorter irradiation time.

Figure 4C:
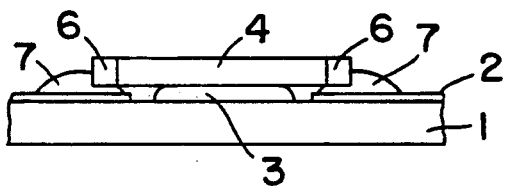

The printed board 1 was set on the apparatus for automatically mounting the tip parts, and the tip electronic part 4 was mounted on and pressed against the adhesive composition 3 with a mounting head to temporarily mount the electronic part 4 as shown in FIG. 4C. In this state, the electronic part 4 was not dislocated when the printed board 1 was vibrated or moved at a high speed. Further, floating or upstanding of the electronic part 4 during reflow of the solder and conducting failure due to contact of adjacent electronic parts 4 could be prevented.

Figure 4D:
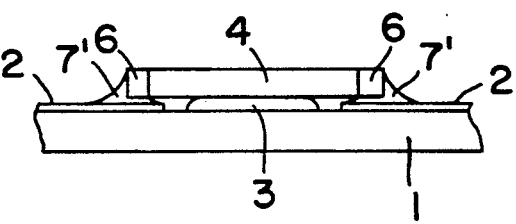

In the solder reflowing step, the printed board 1 was heated with hot air to melt the solder paste. Thereby, the soldering lands 2 of the printed board 1 and respective electrodes 6 of the electronic part were soldered with solder masses 7' as shown in FIG. 4D.

The adhesive composition 3 was thermally cured during preheating in the solder reflow step, whereby heat resistance of the adhesive composition was improved while the pressure sensitive adhesion disappeared.

What is claimed is:
1. An adhesive composition which comprises:
   (1) 10 to 60 parts by weight per 100 parts of the total weight of components (1) to (4) of a monofunctional (meth)acrylic monomer of the formula (I):

$$CH_2=\overset{R^1}{\underset{|}{C}}-CO-(O-R^2)_n-O-R^3 \quad (I)$$

wherein $R^1$ is a hydrogen atom or a methyl group; $R^2$ is a methylene group (—$CH_2$—), an ethylene group (—$C_2H_4$—) or a propylene group (—$C_3H_6$—); $R^3$ is an alkyl group, a phenyl group which may be substituted with not more than two alkyl groups or a group of the formula:

$$-CO-HN-R^4$$

in which $R^4$ is an alkyl group; and n is 1, 2, or 3,
   (2) 0.01 to 10 parts weight per 100 parts of the total weight of components (1) to (4) of a compound having at least two (meth)acryloyl groups in a molecule,
   (3) 30 to 80 parts by weight per 100 parts by weight of the total weight of components (1) to (4) of a heat resistant epoxy resin,
   (4) 0.1 to 20 parts by weight per 100 parts by weight of the total weight of components (1) to (4) of an imidazole compound,
   (5) 0.001 to 10 parts by weight per 100 parts by weight of the total weight of components (1) to (4) of an photopolymerization initiator, and
   (6) 0.01 to 20 parts by weight per 100 parts by weight of the total weight of components (1) to (4) of a saturated aliphatic acid amide as a thixotropic agent.

2. The adhesive composition according to claim 1, wherein said monofunctional (meth)acrylate (1) is at least one compound selected from the group consisting of methoxyethyl (meth)acrylate, methoxypropyl (meth)acrylate, ethoxyethyl (meth)acrylate, ethoxypropyl (meth)acrylate, butoxyethyl (meth)acrylate, butoxypropyl (meth)acrylate, phenoxyethyl (meth)acrylate, phenoxypropyl (meth)acrylate, nonylphenoxyethyl (meth)acrylate, nonylphenoxypropyl (meth)acrylate, ethyl (meth)acrylate butylcarbamate, ethyl (meth)acrylate propylcarbamate, propyl (meth)acrylate butylcarbamate and propyl (meth)acrylate propylcarbamate.

3. The adhesive composition according to claim 1, wherein said compound having at least two (meth)acrylate group in a molecule is at least one compound selected from the group consisting of polyol poly(meth)acrylate, modified polyol poly(meth)acrylate, polyester (meth)acrylate, epoxy (meth)acrylate and urethane (meth)acrylate.

4. The adhesive composition according to claim 1, wherein said photopolymerization initiator is at least one initiator selected from the group consisting of benzoinethylether, diethoxyacetophenone, benzildimethylketal, 2-hydroxy-2-methylpropiophenone and 1-hydroxycyclohexyl phenyl ketone, benzil, benzophenone and 2,4-diethylthioxanthone.

5. The adhesive composition according to claim 1, wherein said heat resistant epoxy resin is an epoxy resin selected from the group consisting of triphenylmethanetriglycidylether, resorcinoldiglycidylether, phenol-novolac type epoxy resin and hydroxyethylisocyanuratetriglycidylether.

6. The adhesive composite according to claim 1 wherein the thixotropic agent is stearamide.

7. A photocurable adhesive composition consisting essentially of (1) 10 to 60 parts by weight per 100 parts of the total weight of components (1) to (4) of at least one monofunctional (meth)acrylic monomer selected from the group consisting of methoxyethyl (meth)acrylate, methoxypropyl (meth)acrylate, ethoxyethyl (meth)acrylate, ethoxypropyl (meth)acrylate, butoxyethyl (meth)acrylate, butoxypropyl (meth)acrylate, phenoxyethyl (meth)acrylate, phenoxypropyl (meth)acrylate, nonylphenoxyethyl (meth)acrylate, nonylphenoxypropyl (meth)acrylate, ethyl (meth)acrylate butylcarbamate, ethyl (meth)acrylate propylcarbamate, propyl (meth)acrylate butylcarbamate and propyl (meth)acrylate propylcarbamate, (2) 0.01 to 10 parts by weight per 100 parts of the total weight of components (1) to (4) of at least one compound having at least two (meth)acryloyl groups in the molecule selected from the group consisting of polyol poly(meth)acrylate, modified polyol poly(meth)acrylate, polyester (meth)acrylate, epoxy (meth)acrylate and urethane (meth)acrylate, (3) 30 to 80 parts by weight per 100 parts by weight of the total weight of components (1) to (4) of a heat resistant epoxy resin selected from the group consisting of triphenylmethanetriglycidylether, resorcinoldiglycidylether, phenol-novolac type epoxy resin and hydroxyethylisocyanuratetriglycidylether, (4) 0.1 to 20 parts by weight per 100 parts by weight of the total weight of components (1) to (4) of an imidazole compound, (5) 0.001 to 10 parts by weight per 100 parts by weight of the total weight of components (1) to (4) of at least one photopolymerization initiator selected from the group consisting of benzoinethylether, diethoxyacetophenone, benzildimethylketal, 2-hydroxy-2-methylpropiophenone and 1-hydroxycyclohexyl phenyl ketone, benzil, benzophenone and 2,4-diethylthioxanthone, and (6) 0.01 to 20 parts by weight per 100 parts by weight of the total weight of components (1) to (4) of a saturated aliphatic acid amide as a thixotropic agent.

8. The photocurable adhesive composite according to claim 7 wherein the thixotropic agent is stearamide.

* * * * *